(12) United States Patent
Janarthanam et al.

(10) Patent No.: US 9,739,819 B2
(45) Date of Patent: Aug. 22, 2017

(54) CABLE JOINT INTEGRITY DETECTION SYSTEMS AND METHODS

(71) Applicant: Ford Global Technologies, LLC, Dearborn, MI (US)

(72) Inventors: Suriyaprakash Ayyangar Janarthanam, Westland, MI (US); Hilde Anne Heremans, Dearborn, MI (US); Nondo G. Basoukeas, Northville, MI (US); Mark J. Ferrel, Brighton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 62 days.

(21) Appl. No.: 14/137,565

(22) Filed: Dec. 20, 2013

(65) Prior Publication Data

US 2015/0177305 A1 Jun. 25, 2015

(51) Int. Cl.
*G01R 31/00* (2006.01)
*G01R 31/04* (2006.01)

(52) U.S. Cl.
CPC ......... *G01R 31/006* (2013.01); *G01R 31/007* (2013.01); *G01R 31/04* (2013.01)

(58) Field of Classification Search
CPC .. A61B 2019/448; H02G 15/24; H02K 15/00; Y10T 29/49826; B60L 11/1816; B60L 11/1851; B60L 2210/40; H02J 7/1438
USPC ......... 324/503, 525, 543, 705, 764; 307/9.1; 320/109
See application file for complete search history.

(56) References Cited

U.S. PATENT DOCUMENTS

| | | | |
|---|---|---|---|
| 4,480,251 A * | 10/1984 | McNaughton et al. ...... | 340/604 |
| 5,949,806 A | 9/1999 | Ness et al. | |
| 6,225,810 B1 * | 5/2001 | Godo et al. .................. | 324/525 |
| 7,997,942 B2 | 8/2011 | Dowman | |
| 2008/0050645 A1 * | 2/2008 | Kai et al. ......................... | 429/61 |
| 2010/0177543 A1 * | 7/2010 | DeDona .................. | B60R 11/00 363/145 |
| 2010/0289516 A1 * | 11/2010 | Mitsutani et al. ........ | 324/764.01 |
| 2011/0050260 A1 * | 3/2011 | Teramoto et al. ............. | 324/705 |
| 2011/0260735 A1 * | 10/2011 | McCabe et al. .............. | 324/543 |
| 2013/0003237 A1 | 1/2013 | Casey | |
| 2013/0264995 A1 * | 10/2013 | Lee ..................... | B60L 11/1803 320/104 |
| 2014/0159478 A1 * | 6/2014 | Ang .............................. | 307/9.1 |
| 2015/0097525 A1 * | 4/2015 | DeDona et al. .............. | 320/109 |

* cited by examiner

*Primary Examiner* — Son Le
*Assistant Examiner* — Akm Zakaria
(74) *Attorney, Agent, or Firm* — David Kelley, Esq.; Tung & Associates

(57) ABSTRACT

An illustrative embodiment of a cable joint integrity detection systems for an electric vehicle includes an electric vehicle power converter module; a fastener joint on the power converter module; vehicle wiring connections electrically interfacing with the power converter module at the fastener joint; a current sensor electrically interfacing with the fastener joint; and a controller interfacing with the current sensor, the current sensor transmits a sensor signal to the controller to ensure connectional integrity between the fastener joint and the vehicle wiring connections. Cable joint integrity detection methods are also disclosed.

19 Claims, 4 Drawing Sheets

CABLE JOINT INTEGRITY DETECTION SYSTEMS AND METHODS

FIELD

Illustrative embodiments of the disclosure are generally directed to Electric Vehicles (EVs). More particularly, illustrative embodiments of the disclosure relate to cable joint integrity detection systems and methods for detecting the integrity of a B+ terminal joint between a DC/DC power converter module and a B+ cable in an EV.

DETAILED DESCRIPTION

In hybrid or fully electric vehicles, a DC/DC power converter module may perform the alternator function. A B+ cable may be used to connect the DC/DC power converter module to the 12V wiring connections of the vehicle. A fastener joint (stud and nut) may used to connect the B+ cable to the DC/DC power converter module. However, cross-threading may compromise the integrity of the fastener joint. An insulated rubber boot or plastic cap may be placed over the fastener joint to prevent inadvertent grounding.

Due to the higher currents which may be associated with the fastener joint, proper operator training and discipline may be required to avoid compromising joint integrity.

Accordingly, cable joint integrity detection systems and methods for detecting the integrity of a B+ terminal joint between a DC/DC power converter module and a B+ cable in an EV may be desirable.

SUMMARY

Illustrative embodiments of the disclosure are generally directed to cable joint integrity detection systems for an electric vehicle. An illustrative embodiment of the systems includes an electric vehicle DC/DC power converter module; a fastener joint on the DC/DC power converter module; vehicle wiring connections electrically interfacing with the DC/DC power converter module at the fastener joint; a current sensor electrically interfacing with the fastener joint; and a controller interfacing with the current sensor, the current sensor transmits a sensor signal to the controller to ensure connectional integrity between the fastener joint and the vehicle wiring connections.

In some embodiments, the system may include an electric vehicle DC/DC power converter module; a fastener joint on the DC/DC power converter module; vehicle wiring connections electrically interfacing with the DC/DC power converter module at the fastener joint; a controller interfacing with the current sensor, the current sensor transmits a sensor signal to the controller to ensure connectional integrity between the fastener joint and the vehicle wiring connections; and a feedback loop electrically interfacing with The DC/DC power converter module at the fastener joint and the controller, the feedback loop transmits a feedback signal to the controller to ensure connectional integrity between the fastener joint and the vehicle wiring connections.

Illustrative embodiments of the disclosure are further generally directed to a cable joint integrity detection method. An illustrative embodiment of the method includes monitoring a signal from a fastener joint on a DC/DC power converter module and indicating a compromised status of the fastener joint if the signal is not received from the fastener joint.

BRIEF DESCRIPTION OF THE DRAWINGS

Illustrative embodiments of the disclosure will now be described, by way of example, with reference to the accompanying drawings, in which.

DETAILED DESCRIPTION

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Moreover, the illustrative embodiments described herein are not exhaustive and embodiments or implementations other than those which are described herein and which fall within the scope of the appended claims are possible. Furthermore, there is no intention to be bound by any expressed or implied theory presented in the preceding technical field, background, brief summary or the following detailed description.

Illustrative embodiments of the disclosure are generally directed to cable joint integrity detection systems and methods which are suitable for detecting the connectional integrity of a B+ terminal joint between an electric vehicle DC/DC power converter module and a B+ cable in an Electric Vehicle (EV). According to the systems and methods, joint integrity can be detected or monitored by measuring current output as it leaves the B+ terminal joint as (a) an intermittent supply (due to make-or-break connections), (b) no current supply (permanently opened up or not connected at all) or (c) a very high current (resulting out of grounding). Alternatively, joint integrity can be detected or monitored by adding a feedback loop to the joint such as via a male-female connector joint. In some embodiments, the feedback loop may be a unique 5V feedback loop. In other embodiments, the feedback loop may be a return 12V feedback loop from the connected joint. Besides monitoring the current or feedback loop values, DTC (Diagnostic Test Codes) can be generated on seeing these signals, and FMEM (Failure Mitigation and Effects Management) can be established.

Figure 1:
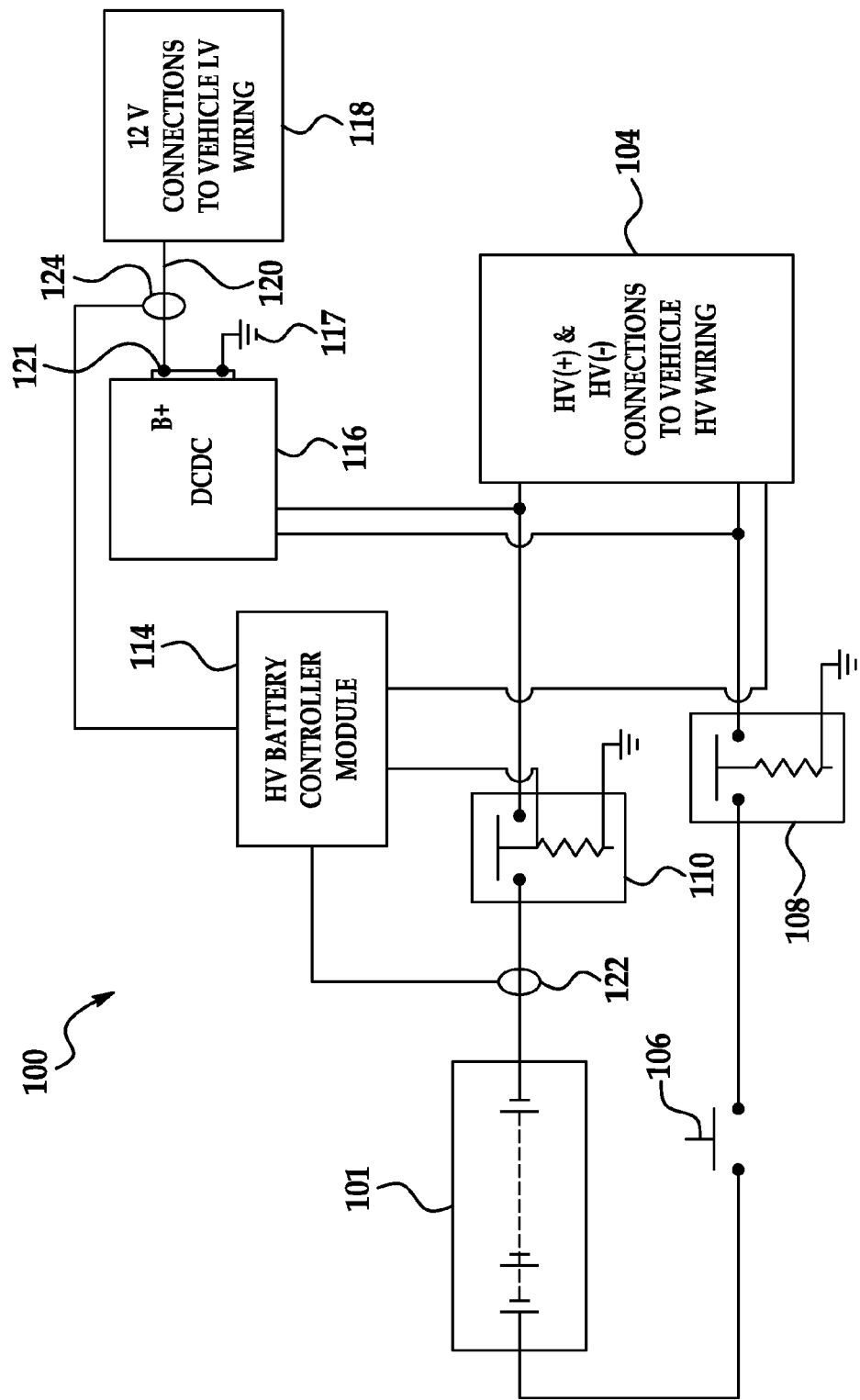
FIG. 1 is a wiring diagram of an illustrative embodiment of the cable joint integrity detection systems.

Referring initially to FIG. 1, a wiring diagram of an illustrative embodiment of the cable joint integrity detection system, hereinafter system 100, is shown. The system 100 may include an HV (Hybrid Vehicle) battery controller module 114. A negative contactor 110 may electrically interface with the HV battery controller module 114. An HV battery cell array 101 may electrically interface with the negative contactor 110. A positive contactor 108 may electrically interface with the HV battery cell array 101. A service disconnect 106 may be provided between the HV battery cell array 101 and the positive contactor 108.

Positive and negative vehicle wiring connections 104 to the vehicle HV wiring (not shown) may electrically interface with the positive contactor 108 and the negative contactor 110. An electric vehicle DC/DC (Direct Current/Direct Current) power converter module 116 having a ground 117 may electrically interface with the positive and negative vehicle wiring connections 104. The DC/DC power converter module 116 may electrically interface with the 12V vehicle wiring connections 118 of the HV vehicle through a B+ cable 120. A fastener joint 121 may connect the B+ cable 120 to the DC/DC power converter module 116.

An HV current sensor 122 electrically interfaces with the HV battery controller module 114. The HV current sensor 122 may be electrically connected between the HV battery cell arrays 101 and the negative contactor 110. A 12V current sensor 124 electrically interfaces with the HV battery controller module 114. The 12V current sensor 124 may be electrically connected to the B+ cable 120 between the fastener joint 121 and the 12V vehicle wiring connector 118.

Throughout operation of the vehicle, the HV battery controller module 114 monitors the connectional integrity between the fastener joint 121 and the 12V vehicle wiring connections 118 by receiving electrical sensor signals from the HV current sensor 122 and the 12V current sensor 124. In the event that the integrity of the fastener joint 121 is compromised, the electrical connection between the DC/DC power converter module 116 and the 12V vehicle wiring connections 118 is either broken or intermittent (otherwise it is compromised), and the 12V current sensor 124 no longer transmits the electrical sensor signal or may be transmitting intermittent signal to the HV battery controller module 114. Accordingly, the HV battery controller module 114 may generate Diagnostic Test Codes (DTC) which indicate the compromised status of the fastener joint 121 such that corrective measures can be taken. Additionally or alternatively, the HV battery controller module 114 may establish Failure Mitigation and Effects Management (FMEM).

Figure 2:
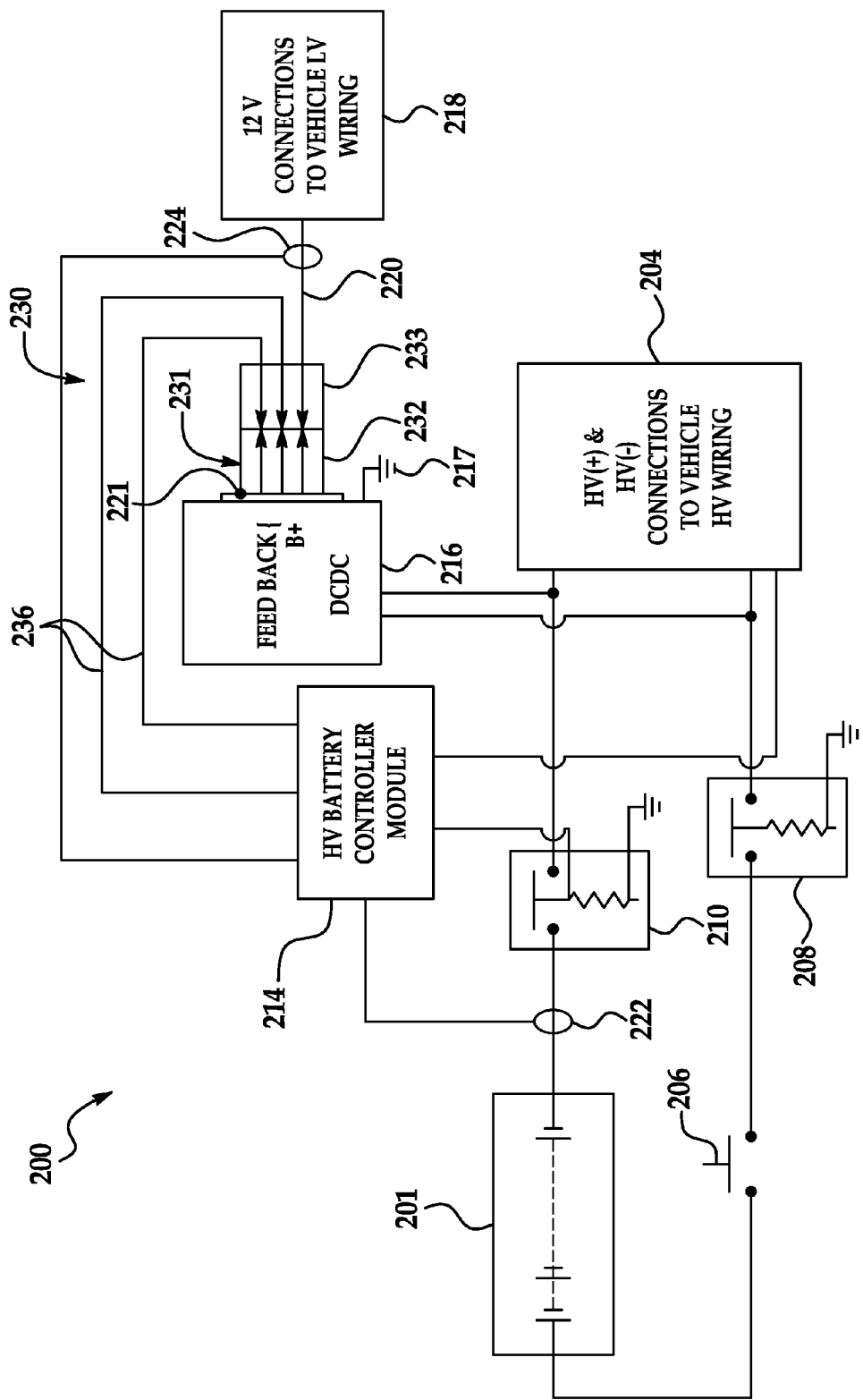
FIG. 2 is a wiring diagram of an alternative illustrative embodiment of the cable joint integrity detection systems.

Referring next to FIG. 2, a wiring diagram of an alternative illustrative embodiment of the cable joint integrity detection system 200 is shown. In the system 200, elements which are analogous to the respective elements of the system 100 that was heretofore described with respect to FIG. 1 are designated by the same numeral in the 200 series in FIG. 2. A feedback loop 230 may electrically connect the B+ joint 221 on the DC/DC power converter module 216 to the HV battery controller module 214. The feedback loop 230 may include a connector joint 231. The connector joint 231 may include a connector joint socket 232 which electrically interfaces with the fastener joint 221 on the DC/DC power converter module 216. In some embodiments, the connector joint socket 232 may be molded onto the DC/DC power converter module 216. A connector joint plug 233 may be detachably coupled to the connector joint socket 232. Feedback loop wiring 236 may extend from the connector joint plug 233. The feedback loop wiring 236 may electrically interface with the HV battery controller module 214. The B+ cable 220 may also extend from the connector joint plug 233. The 12V current sensor 224 which electrically interfaces with the DC/DC power converter module 216 may be electrically connected to the B+ cable 220 between the connector joint 231 and the 12V vehicle wiring connections 218. When the connector joint plug 233 is coupled to the connector joint socket 232, the 12V vehicle wiring connections 218 are disposed in electrical contact with the DC/DC power converter module 216 through the B+ joint 221, the connector joint 231 and the B+ cable 220. The HV battery controller module 214 is disposed in electrical contact with the DC/DC power converter module 216 through the B+ joint 221, the connector joint 231 and the feedback loop wiring 236, respectively.

Throughout operation of the vehicle, the HV battery controller module 214 monitors the connectional integrity between the fastener joint 221 and the 12V vehicle wiring connections 218. A feedback loop signal is transmitted from the DCDC module 216 to the HV battery controller module 214 through the B+ joint 221, the connector joint 231 and the feedback loop wiring 236, respectively. Electrical sensor signals may be transmitted from the HV current sensor 222 and from the 12V current sensor 224 to the HV battery controller module 214. When the connector joint plug 233 is securely inserted in the connector joint socket 232, the feedback loop wiring 236 maintains electrical communication between the B+ joint 221 and the HV battery controller module 214 and ensures transmission of the feedback loop signal to the HV battery controller module 214. Accordingly, the feedback loop 230 continually verifies the secure connection between the 12V vehicle wiring connections 218 and the B+ joint 221 of the DC/DC power converter module 216.

In the event that the connection between the connector joint plug 233 and the connector joint socket 232 at the B+ joint 221 is compromised, the feedback loop signal is no longer transmitted from the DC/DC power converter module 216 through the feedback loop 230 to the HV battery controller module 214 and thus, no longer verifies the secure connection between the 12V vehicle wiring connections 218 and the B+ joint 221. Additionally, the electrical connection between the DC/DC power converter module 216 and the HV battery controller module 214 is broken, and the 12V current sensor 224 no longer transmits the electrical sensor signal to the HV battery controller module 214. Accordingly, the HV battery controller module 214 may generate the Diagnostic Test Codes (DTC) which indicate the compromised status of the B+ joint 221 and/or may establish Failure Mitigation and Effects Management (FMEM).

Figure 3:
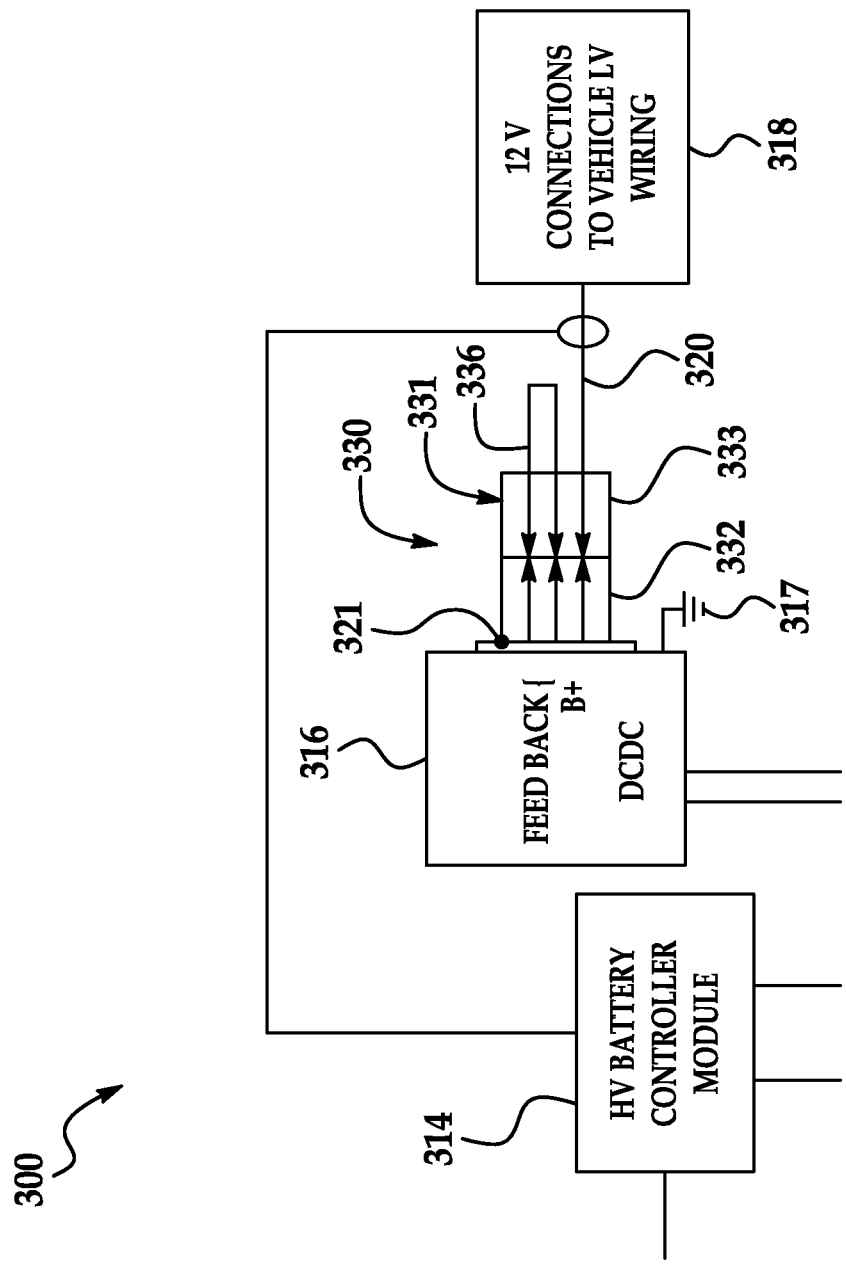
FIG. 3 is a wiring diagram of another alternative illustrative embodiment of the cable joint integrity detection systems.

Referring next to FIG. 3, a wiring diagram of another alternative illustrative embodiment of the cable joint integrity detection system 300 is shown. In the system 300, elements which are analogous to the respective elements of the system 100 that was heretofore described with respect to FIG. 1 are designated by the same numeral in the 300 series in FIG. 3. In the system 300, the DC/DC power converter module 316 may be adapted to monitor the integrity of the B+ joint 321 through the feedback loop 330. Accordingly, the feedback loop wiring 336 may feed from the DC/DC power converter module 316 through the connector joint socket 332 and the connector joint plug 333, respectively, of the connector joint 331, and then feed from the connector joint plug 333 through the connector joint socket 332 back to the DC/DC power converter module 316. Therefore, a feedback loop signal is transmitted from the DC/DC power converter module 316 through the feedback loop wiring 336 and back to the DC/DC power converter module 316 at the B+ joint 321.

In the event that the connection between the connector joint plug 333 and the connector joint socket 332 at the B+ joint 321 is compromised, the DC/DC power converter module 316 no longer receives the feedback signal which normally verifies the secure connection between the 12V vehicle wiring connections 318 and the B+ joint 321. Additionally, the electrical connection between the DC/DC power converter module 316 and the HV battery controller module 314 is broken, and the 12V current sensor 324 no longer transmits the electrical sensor signal to the HV battery controller module 314. Accordingly, the DC/DC power converter module 316 and/or the HV battery controller module 314 may generate the Diagnostic Test Codes (DTC) which indicate the compromised status of the B+ joint 321 and/or may establish Failure Mitigation and Effects Management (FMEM).

Figure 4:
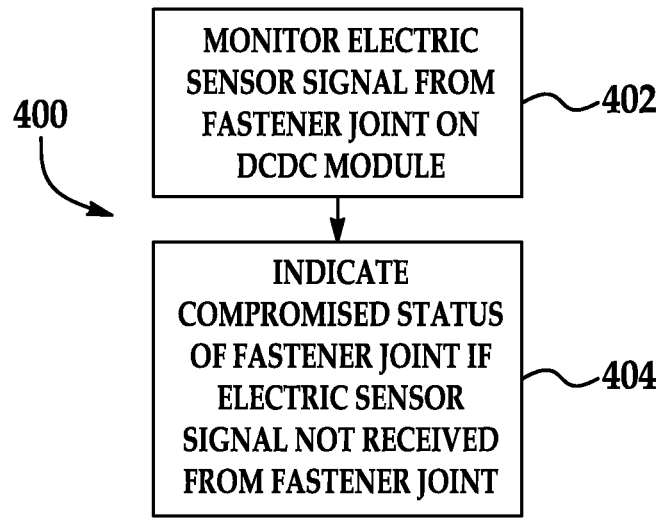
FIG. 4 is a flow diagram of an illustrative embodiment of the cable joint integrity detection systems.

Referring next to FIG. 4, a flow diagram of an illustrative embodiment of the cable joint integrity detection systems 400 is shown. At block 402, an electric sensor signal from a fastener joint on a DC/DC power converter module of an electric vehicle is monitored to ensure electrical connection between the 12V vehicle wiring connections of the vehicle and the DC/DC power converter module. In some embodiments, an HV battery controller module may monitor the electric sensor signal. In other embodiments, the DC/DC power converter module or some other controller may monitor the electric sensor signal. At block 404, a compromised status of the fastener joint may be indicated if the electric sensor signal is no longer received from the fastener joint. In some embodiments, Diagnostic Test Codes (DTC) which indicate the compromised status of the fastener joint may be generated. In some embodiments, Failure Mitigation and Effects Management (FMEM) may be established.

It will be appreciated by those skilled in the art that use of a male/female connector joint 231/331 to connect the feedback loop 230/330 to the HV battery controller module 214/314 may prevent cross-threading and consequent compromise of integrity at the fastener joint 121; eliminate the need for an insulated rubber boot at the fastener joint 121; and save assembly time, reduce assembly operator count, save tool, material and inventory cost associated with fabrication. In the event that the fastener joint 121 is located on the underbody or underhood area of a vehicle, use of a quick connector for the connector joint 231/331 may facilitate a proper seal at the fastener joint 121. The systems and methods of the disclosure can be applied to B+ fastener joints on an alternator on regular vehicle application as well as on any higher-voltage or higher-current electrical joints on any vehicle application.

Figure 5:
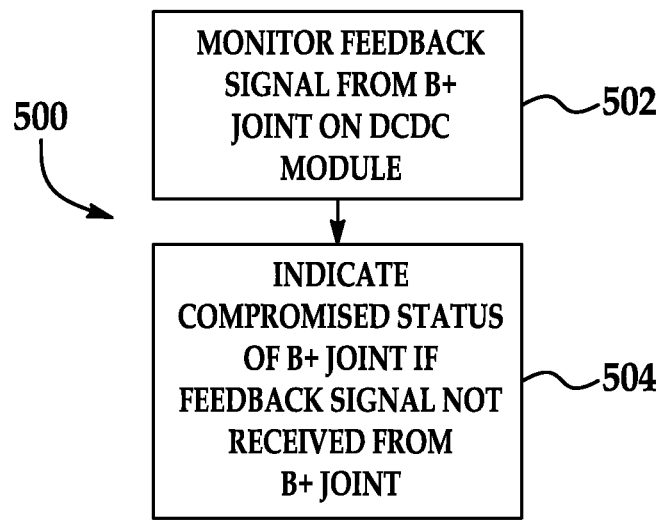
FIG. 5 is a flow diagram of an alternative illustrative embodiment of the cable joint integrity detection systems.

Referring next to FIG. 5, a flow diagram of an illustrative embodiment of the cable joint integrity detection systems 500 is shown. At block 502, a feedback signal from a B+ joint on a DC/DC power converter module of an electric vehicle is monitored to ensure electrical connection between the 12V vehicle wiring connections of the vehicle and the DC/DC power converter module. In some embodiments, an HV battery controller module may monitor the feedback signal. In other embodiments, the DC/DC power converter module or some other controller may monitor the feedback signal. At block 504, a compromised status of the B+ joint may be indicated if the feedback signal is no longer received from the B+ joint. In some embodiments, Diagnostic Test Codes (DTC) which indicates the compromised status of the B+ joint may be generated. In some embodiments, Failure Mitigation and Effects Management (FMEM) may be established.

Although the embodiments of this disclosure have been described with respect to certain exemplary embodiments, it is to be understood that the specific embodiments are for purposes of illustration and not limitation, as other variations will occur to those of skill in the art.

What is claimed is:

1. A cable joint integrity detection system, comprising:
a power converter module having a fastener joint;
a positive voltage vehicle wiring electrically connected with the power converter module at the fastener joint, the fastener joint comprising a substantially continuous positive voltage electrical connection between the a positive voltage vehicle wiring comprising a B+ cable and a B+ terminal of the power converter module; and
at least one current sensor electrically interfacing with the fastener joint to transmit a respective sensor signal to a controller, the controller comprising memory storing a computer program instructions and at least one processor configured to execute the computer program, the controller configured by the computer program to monitor the electrical connection integrity between the fastener joint and the positive voltage vehicle wiring connections by monitoring a respective current sensor to determine substantially continuous receipt of the respective sensor signal by the controller, the controller further configured to indicate a compromised status of the substantially continuous positive voltage electrical connection in the case the receipt of the respective sensor signal is not substantially continuous.

2. The system of claim 1 wherein the controller comprises a hybrid vehicle battery controller module.

3. The system of claim 1 further comprising a negative contactor, hybrid vehicle battery cell arrays electrically interfacing with the negative contactor and a second current sensor electrically connected between the negative contactor and the hybrid vehicle battery cell arrays.

4. The system of claim 3 further comprising positive and negative vehicle wiring connections electrically interfacing with the negative contactor and the hybrid vehicle battery cell arrays.

5. The system of claim 4 further comprising a positive contactor electrically interfacing with the positive and negative vehicle wiring connections and the hybrid vehicle battery cell arrays.

6. The system of claim 5 further comprising a service disconnect between the hybrid vehicle battery cell arrays and the positive contactor.

7. The system of claim 1 further comprising a substantially continuously electrically connected positive voltage feedback loop electrically interfacing with the power converter module at the fastener joint and the controller, the feedback loop configured to transmit a feedback signal from the fastener joint to the controller and back to the fastener joint, the controller further configured to ensure the electrical connection integrity of the feedback loop by monitoring the feedback signal to determine substantially continuous electrical communication of the feedback signal between the fastener joint and the controller.

8. The system of claim 7 wherein the feedback loop comprises a connector joint connected to a B+ terminal comprising the fastener joint and the feedback loop is electrically connected to the connector joint and the controller.

9. A cable joint integrity detection system for an electric vehicle, comprising:
an electric vehicle power converter module;
a fastener joint on the power converter module;
a positive voltage vehicle wiring connections electrically interfacing with the power converter module at the fastener joint, the fastener joint comprising a substantially continuous positive voltage electrical connection comprising a B+ cable between the a positive voltage vehicle wiring and a B+ terminal of the power converter module;

a controller interfacing with at least one current sensor, the at least one current sensor configured to transmit a respective sensor signal to the controller, the controller comprising memory storing a computer program instructions and at least one processor configured to execute the computer program, the controller configured by the computer program to ensure the electrical connection integrity between the fastener joint and the vehicle wiring connections by monitoring for substantially continuous receipt of the respective sensor signal by the controller; and a positive voltage feedback loop electrically interfacing with the power converter module at the fastener joint and the controller, the feedback loop configured to transmit a feedback signal from the fastener joint to the controller and back to the fastener joint, the controller further configured to ensure the electrical connection integrity of the feedback loop by monitoring the feedback signal to determine substantially continuous electrical communication of the feedback signal between the fastener joint and the controller, the controller further configured to indicate a compromised status of the substantially continuous positive voltage electrical connection in the case the receipt of the respective sensor signal is not substantially continuous.

10. The system of claim 9 wherein the controller comprises a hybrid vehicle battery controller module.

11. The system of claim 9 further comprising a negative contactor, hybrid vehicle battery cell arrays electrically interfacing with the negative connector and a second current sensor electrically connected between the negative contactor and the hybrid vehicle battery cell arrays.

12. The system of claim 11 further comprising positive and negative vehicle wiring connections electrically interfacing with the negative contactor and the hybrid vehicle battery cell arrays.

13. The system of claim 12 further comprising a positive contactor electrically interfacing with the positive and negative vehicle wiring connections and the hybrid vehicle battery cell arrays.

14. The system of claim 13 further comprising a service disconnect between the hybrid vehicle battery cell arrays and the positive contactor.

15. The system of claim 9 wherein the controller comprises the power converter module.

16. The system of claim 9 wherein the feedback loop comprises a connector joint connected to a B+ terminal on the fastener joint and wherein the feedback loop is electrically connected to the connector joint and the controller.

17. A cable joint integrity detection method, comprising:
providing a controller, the controller configured to:
monitor a sensor signal from a current sensor, the current sensor electrically interfacing with a fastener joint on a power converter module, the fastener joint comprising a substantially continuous positive voltage electrical connection between vehicle wiring comprising a B+ cable and the power converter module; and
indicate a compromised status of the fastener joint if the sensor signal is not substantially continuously received by the controller from the fastener joint;
wherein monitoring the sensor signal comprises monitoring a feedback loop signal through a positive voltage feedback loop electrically interfacing with the fastener joint, the feedback loop configured to transmit a feedback signal from the fastener joint to the controller and back to the fastener joint.

18. The method of claim 17 wherein indicating a compromised status comprises generating diagnostic test codes which indicate the compromised status of the fastener joint.

19. The system of claim 1 wherein the controller is configured to indicate a compromised status of the fastener joint in the event of non-receipt or intermittent receipt of the sensor signal by the controller.

* * * * *